(12) United States Patent
Wang et al.

(10) Patent No.: US 6,269,041 B1
(45) Date of Patent: Jul. 31, 2001

(54) EMBEDDED AUTO-REFRESH CIRCUIT FOR PSEUDO STATIC RANDOM ACCESS MEMORY

(75) Inventors: Thomson Wang, Hsinchu Hsien; Thomas Chen, Hsinchu, both of (TW)

(73) Assignee: Sunplus Technology Co., Ltd. (TW)

( * ) Notice: Subject to any disclaimer, the term of this patent is extended or adjusted under 35 U.S.C. 154(b) by 0 days.

(21) Appl. No.: 09/563,431

(22) Filed: May 3, 2000

(51) Int. Cl.[7] .................................................. G11C 7/00
(52) U.S. Cl. ............................................................ 365/222
(58) Field of Search ..................................... 365/222, 203, 365/194, 236, 189.12

(56) References Cited

U.S. PATENT DOCUMENTS 5,033,026 * 7/1991 Tsujimoto ............................ 365/222
5,289,424 * 2/1994 Ito et al. ............................... 365/222
5,517,454 * 5/1996 Sato et al. ............................ 365/222

* cited by examiner

Primary Examiner—Trong Phan
(74) Attorney, Agent, or Firm—Lowe Hauptman Gilman & Berner, LLP

(57) ABSTRACT

An embedded auto-refresh circuit is provided to automatically refresh pseudo static random access memory cells. The embedded auto-refresh circuit includes a shift register and an auto-refresh generation circuit. The shift register is driven by a clock signal to perform shift operations. The auto-refresh generation circuit has a pre-charge and refresh signal generator driven by the clock signal to generate a refresh signal and a pre-charge signal. The pre-charge signal has a first pulse and a second pulse. In a memory access cycle, a plurality of memory cells on a word line determined by the refresh signal and the shift register are refreshed by a pseudo read operation based on the first pulse and the refresh signal, and then a general random memory access process is performed by taking the second pulse as a pre-charge signal.

10 Claims, 7 Drawing Sheets

EMBEDDED AUTO-REFRESH CIRCUIT FOR PSEUDO STATIC RANDOM ACCESS MEMORY

BACKGROUND OF THE INVENTION

1. Field of the Invention

The present invention relates to the field of pseudo static random access memory and, more particularly, to an embedded auto-refresh circuit to refresh static random access memory cells without the associated processing system being halted.

2. Description of Related Art

Conventionally, the Static Random Access Memory (SRAM) cell is typically configured to a Six-Transistor SRAM cell, as shown in FIG. 6, or a Resistive-Load SRAM cell, as shown in FIG. 7. In addition, FIG. 8 shows a Four-Transistor pseudo SRAM cell, which is able to save about half the layout area as compared to the Six-Transistor SRAM, and does not need an additional process to form a resistor as compared to the Resistive-Load SRAM. Furthermore, the Four-Transistor pseudo SRAM cell is provided with a better data stability as compared to the Dynamic Random Access Memory (DRAM). Therefore, the above Four-Transistor pseudo SRAM cells are widely used in electronic circuitry. However, it is known that the electric charge in the drain of such a Four-Transistor pseudo SRAM cell is prone to disappear due to sub-threshold leakage. As such, it is necessary to refresh the Four-Transistor pseudo SRAM cells in every predefined period of time in order to ensure the integrity of data.

A memory circuit constituted by the above Four-Transistor pseudo SRAM cell is shown in FIG. 9. As shown, there are a plurality of cells 91 arranged in a matrix form. The cells 91 of each row are connected to a word line (WL) 92, while the cells 91 of each column are connected to a bit line pair consisting of a bit line (BL) 931 and an inverted bit line ($\overline{BL}$) 932. To access memory, a pre-charge circuit 95 is enabled to charge the bit line 931 and inverted bit line 932 to a voltage level of logic "1" to clear the original data on the bit line pair, so as to avoid data overwriting in the subsequent memory access. The address from an address bus 96 is decoded by an address decoder 94 to select the cells 91 on a word line 92 to perform a read or write operation.

A block diagram of a typical system configured by the above Four-Transistor pseudo SRAM and the timing diagram thereof are shown in FIG. 10 and FIG. 11, respectively. As shown in FIG. 10, an additional refresh circuit 97 is employed to carry out the memory refresh operation. That is, when the memory system 98 is required to be refreshed, the refresh circuit 97 stops the current procedure in the processing system 99 and asserts the R/$\overline{W}$ signal to issue a pseudo read operation to the memory system 98 for memory refresh. It is obvious that the processing system 99 has to be halted when the memory system 98 is in refresh, and thus a lot of bandwidth that can be used for data processing is wasted. The drawback of wasting bandwidth is even more troublesome as the semiconductor manufacturing process develops into the deep sub-micron technique, hence the sub-threshold leakage is increasing. Therefore, there is a need for the above Four-Transistor pseudo SRAM to be improved.

SUMMARY OF THE INVENTION

The object of the present invention is to provide an embedded auto-refresh circuit for automatically refreshing pseudo static random access memory cells without the need of additional pseudo read cycles, such that no system resources are wasted.

To achieve the above object, the embedded auto-refresh circuit in accordance with the present invention includes a shift register and an auto-refresh generation circuit. The shift register is driven by a clock signal to perform shift operations. The auto-refresh generation circuit has a pre-charge and refresh signal generator driven by the clock signal to generate a refresh signal and a pre-charge signal. The pre-charge signal has a first pulse and a second pulse. In a memory access cycle, a plurality of memory cells on a word line determined by the refresh signal and the shift register are refreshed by a pseudo read operation based on the first pulse and the refresh signal, and then a general random memory access process is performed by taking the second pulse as a pre-charge signal.

The above and other objects, features and advantages of the present invention will become apparent from the following detailed description taken with the accompanying drawings.

DETAILED DESCRIPTION OF THE PREFERRED EMBODIMENTS

Figure 1:
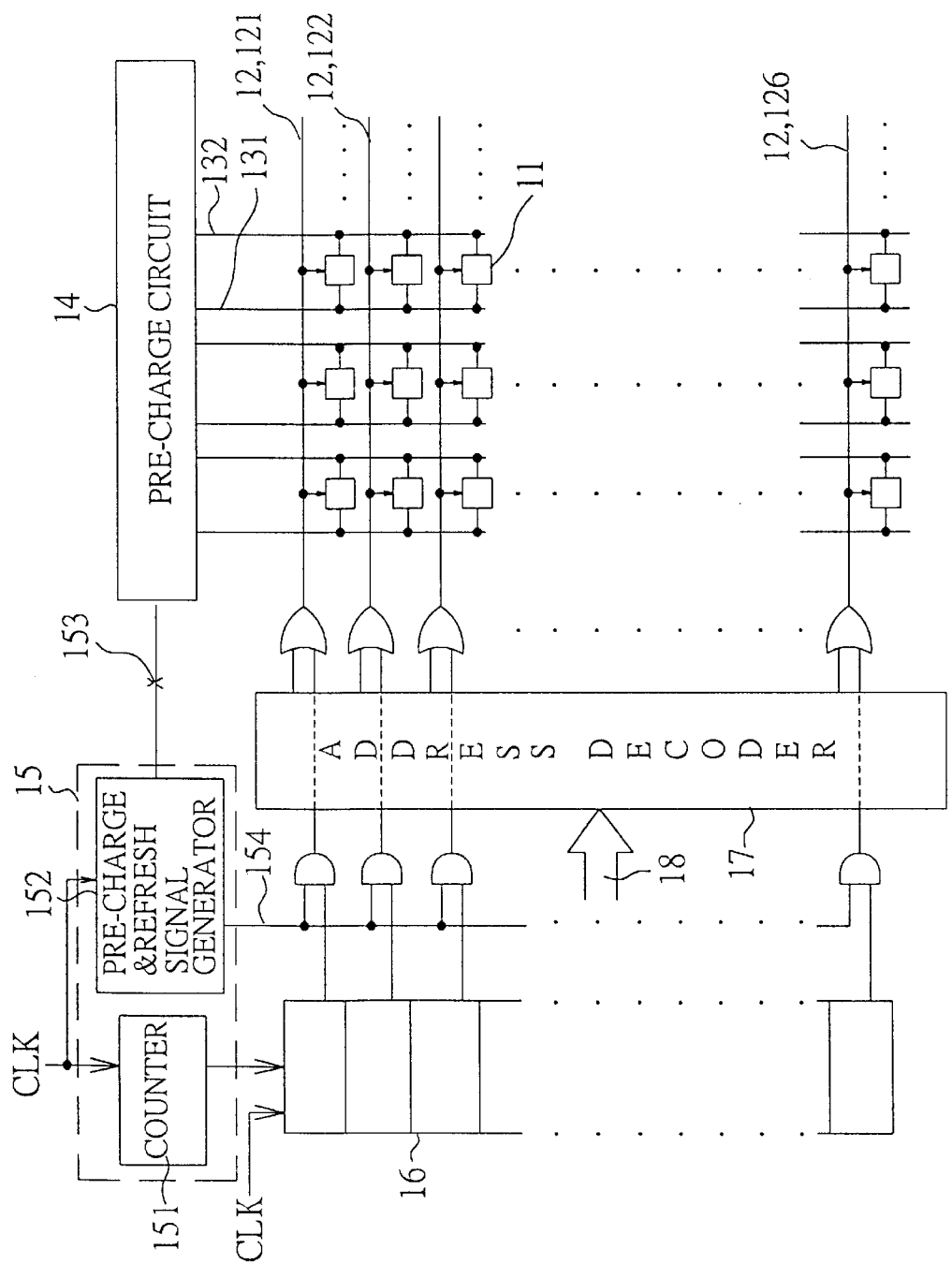
FIG. 1 is a circuit diagram of an embedded auto-refresh circuit for pseudo static random access memory in accordance with the present invention.

Referring to FIG. 1, there is shown an embedded auto-refresh circuit for pseudo static random access memory in accordance with the present invention. As shown, a memory circuit is comprised of a plurality of Four-Transistor pseudo SRAM cells 11 arranged in a matrix form. The cells 11 of each row are connected to a word line 12, while the cells 11 of each column are connected to a bit line pair consisting of a bit line 131 and an inverted bit line 132. A pre-charge circuit 14 is provided to charge the bit line 131 and inverted bit line 132 so as to clear the original data for performing memory access.

An auto-refresh generation circuit 15 is provided to automatically initiate a memory refresh process. The auto-refresh generation circuit 15 includes a counter 151 and a pre-charge & refresh signal generator 152. The counter 151 is provided to cyclically count the number of clocks in the system clock signal (CLK). As such, a logic "1" is output to a shift register 16 at the end of each counting cycle. The shift register 16 is driven by the clock signal so as to shift one bit for every clock. The pre-charge & refresh signal generator 152 is driven by the clock signal to generate a pre-charge signal 153 and a refresh signal 154 for performing a memory access operation and a refresh operation, respectively.

The shift register 16 has a plurality of bits, each having an output that is ANDed with the refresh signal 154 by an AND gate. The output of each AND gate is ORed with a corresponding encoding output of an address decoder 17 by an OR gate. Furthermore, the output of each OR gate is connected to a corresponding word line 12 of the memory, so as to drive the word line 12 selected by the address bus 18.

Figure 2:
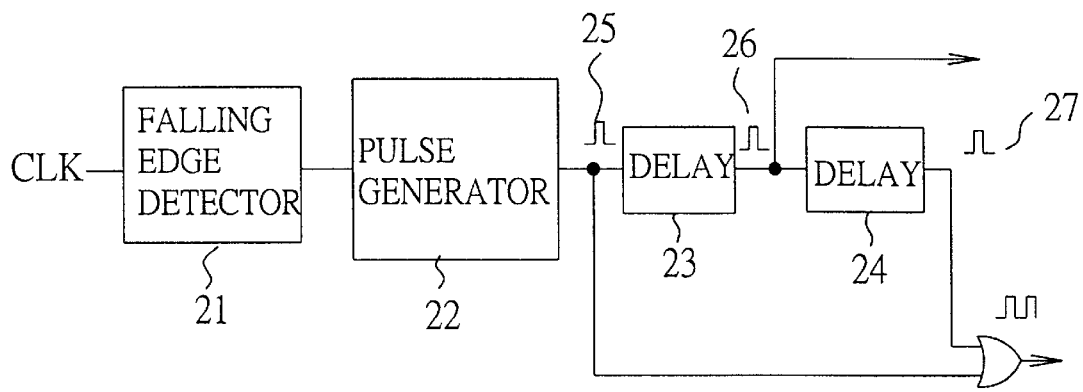
FIG. 2 is a block diagram of the auto-refresh generation circuit shown in FIG. 1.
Figure 3:
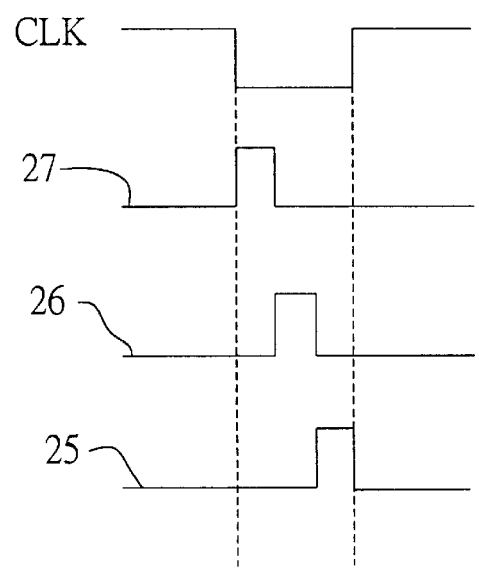
FIG. 3 shows the waveforms of the pre-charge signal and refresh signal in accordance with the present invention.

The structure of the pre-charge & refresh signal generator 152 is shown in FIG. 2, which includes a falling edge detector 21, a pulse generator 22, and two delay elements 23 and 24 serially connected together. The falling edge detector 21 is provided to detect the falling edge of the clock signal, and when detecting such, drives the pulse generator 22 to produce a pulse 25 having a width about one third of the low level duration of one clock in the clock signal. The pulse 25 is further applied to the delay elements 23 and 24 for being delayed so as to obtain a one-time delayed pulse 26 and a two-time delayed pulse 27. The delay time of each of the delay elements 23 and 24 is about one third of the low level duration of one clock in the clock signal. Therefore, with reference to FIG. 3, the pulses 25, 26, and 27 are sequentially and continuously produced in the low level duration of one clock in the clock signal, wherein the one-time delayed pulse 26 is provided as a refresh signal 154, and the pulse 25 and the two-time delayed pulse 27 are combined via an OR gate to generate the pre-charge signal 153.

Figure 4:
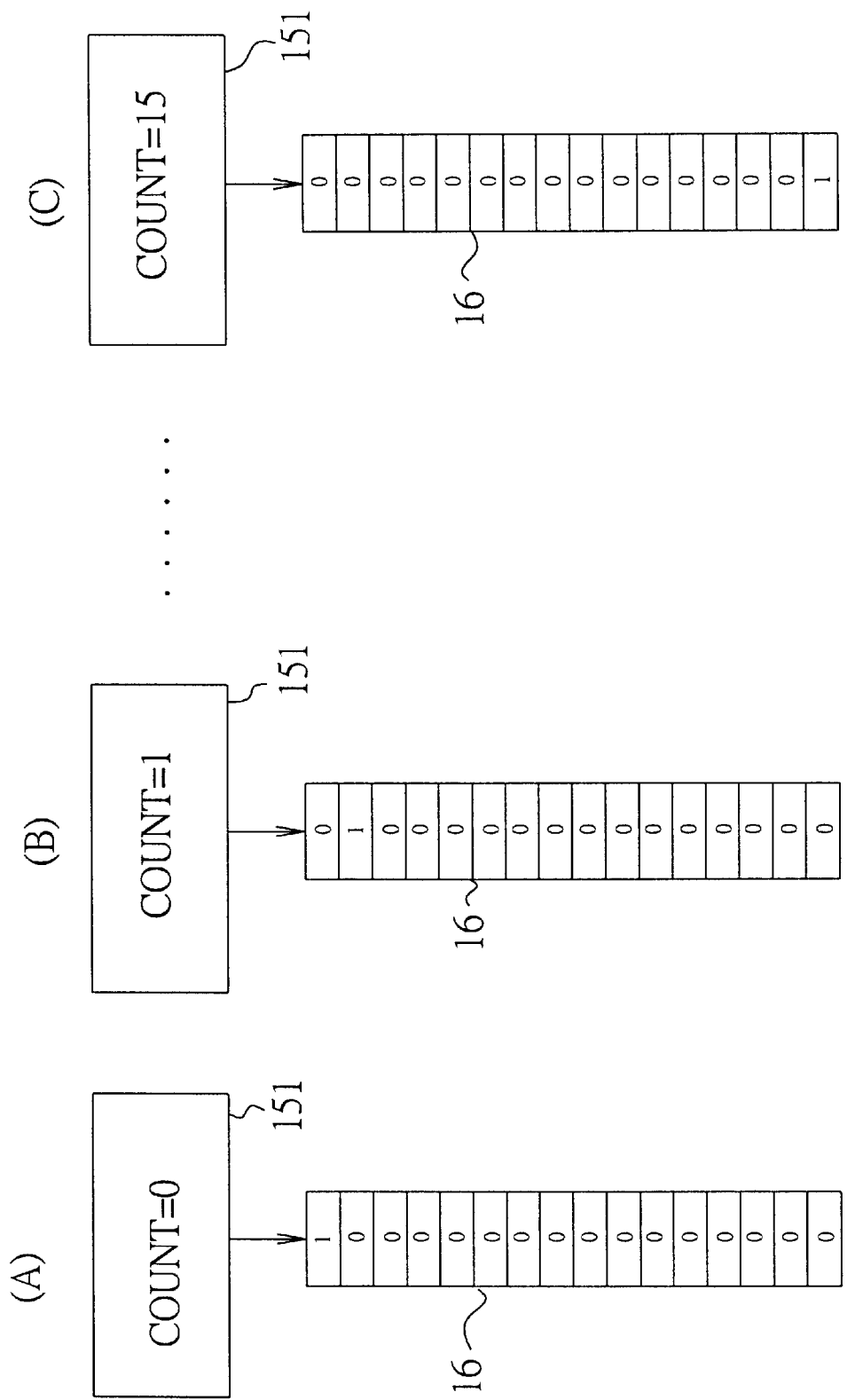
FIGS. 4A, 4B, and 4C schematically illustrate the operation processes of the embedded auto-refresh circuit in accordance with the present invention.
Figure 5:
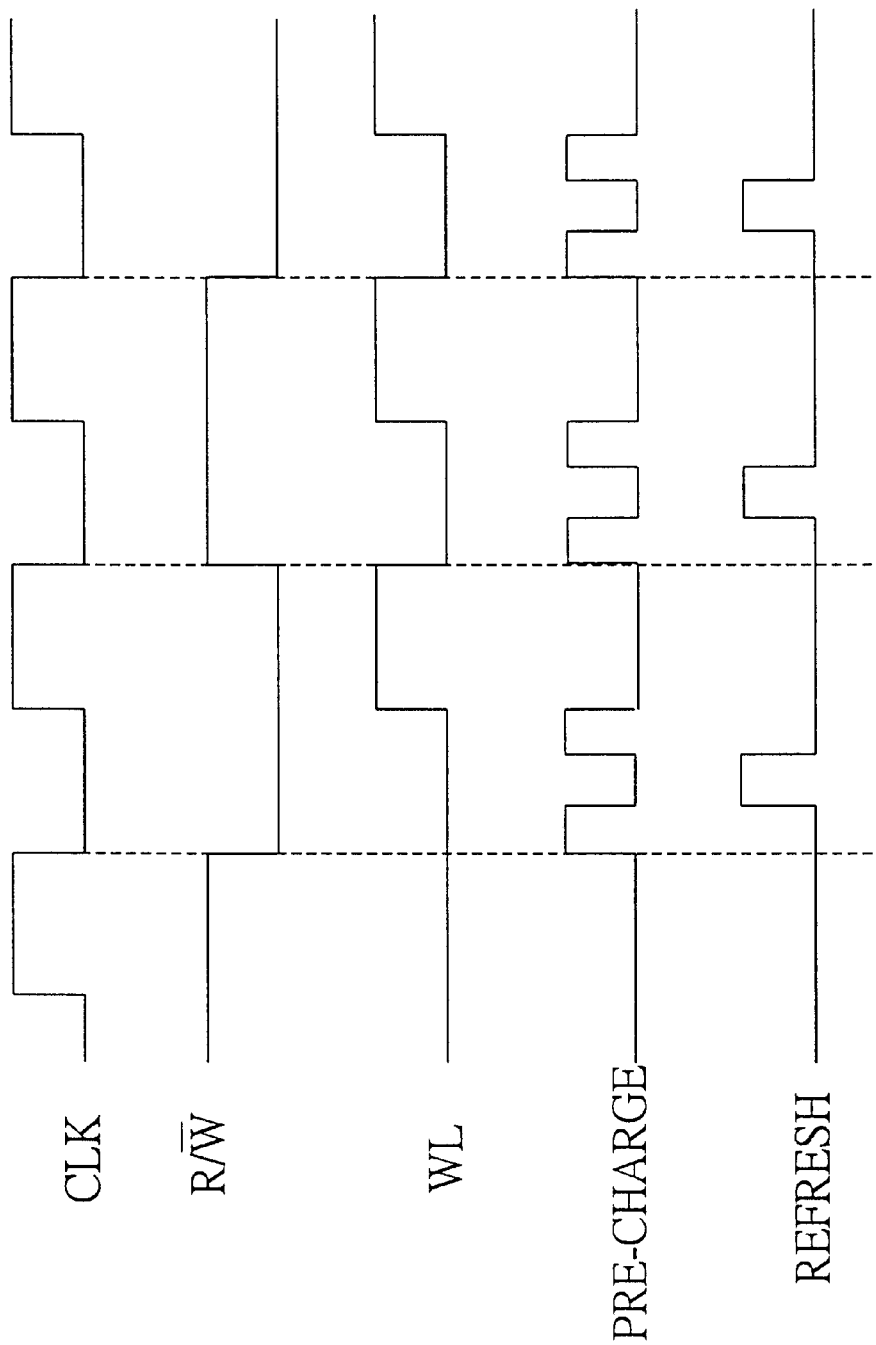
FIG. 5 is a timing diagram showing the read/write cycles of the embedded auto-refresh circuit for pseudo static random access memory in accordance with the present invention.
Figure 6:
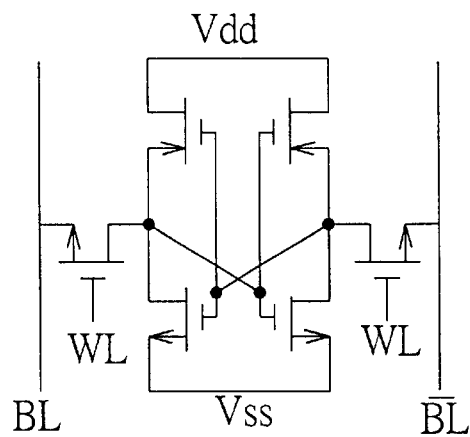
FIG. 6 is a circuit diagram of a conventional Six-Transistor static random access memory cell.
Figure 7:
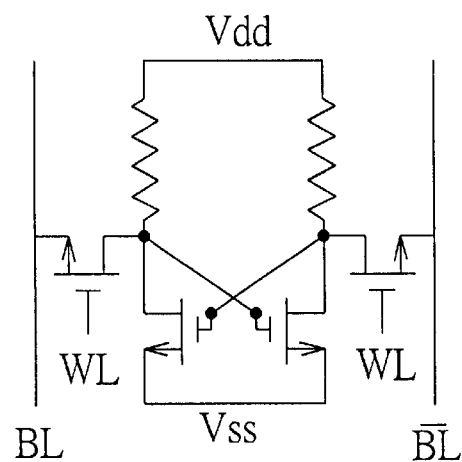
FIG. 7 is a circuit diagram of a conventional Resistive-Load static random access memory cell.
Figure 8:
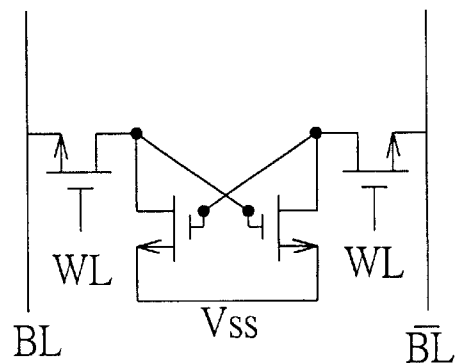
FIG. 8 is a circuit diagram of a conventional Four-Transistor pseudo static random access memory cell.
Figure 9:
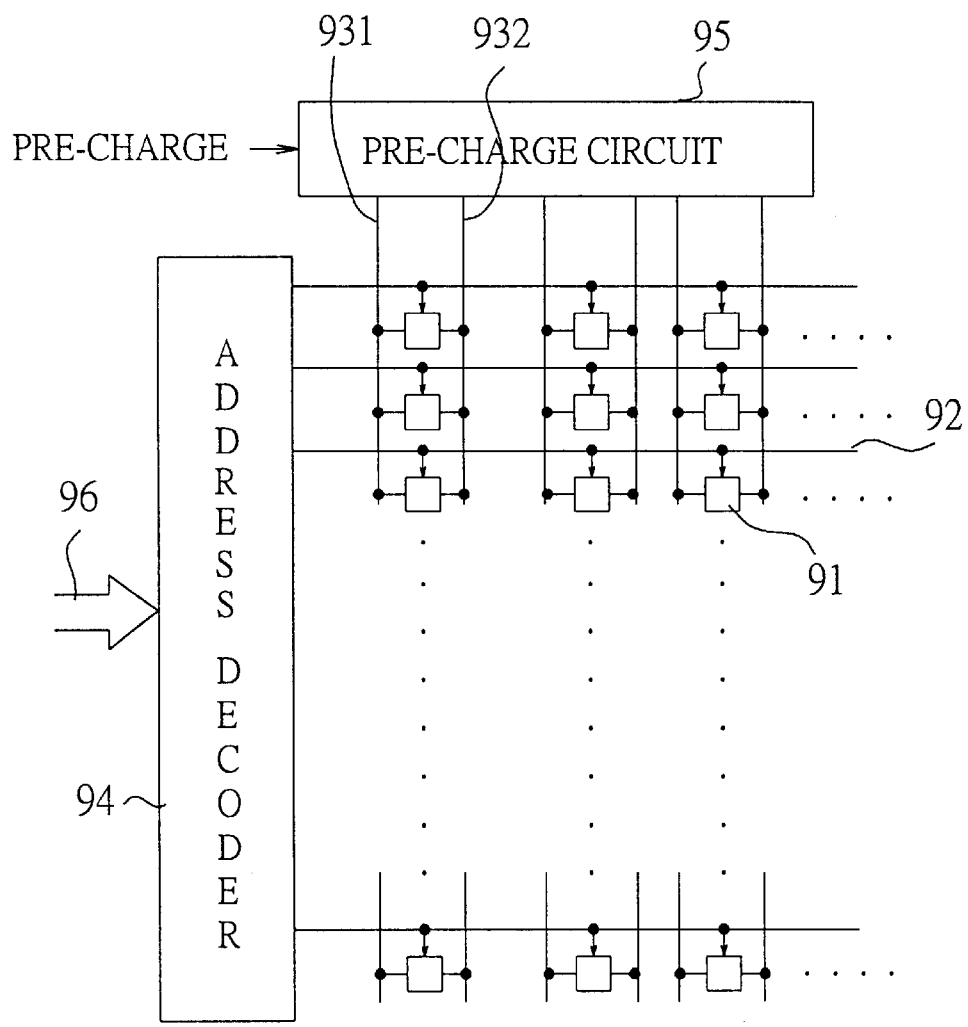
FIG. 9 is the circuit diagram of a memory system configured by conventional Four-Transistor pseudo static random access memory cells.
Figure 10:
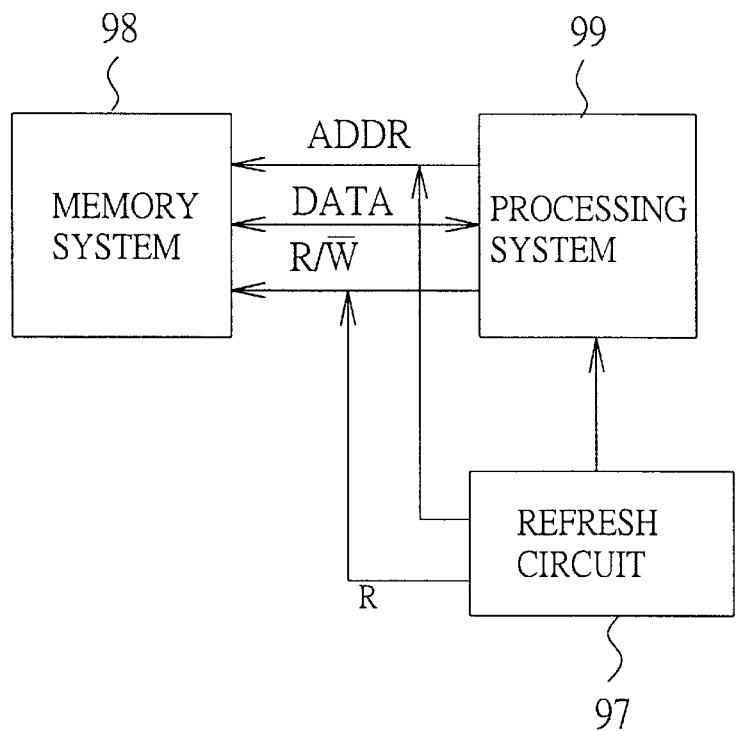
FIG. 10 shows an application of the memory system configured by conventional Four-Transistor pseudo static random access memory cells.
Figure 11:
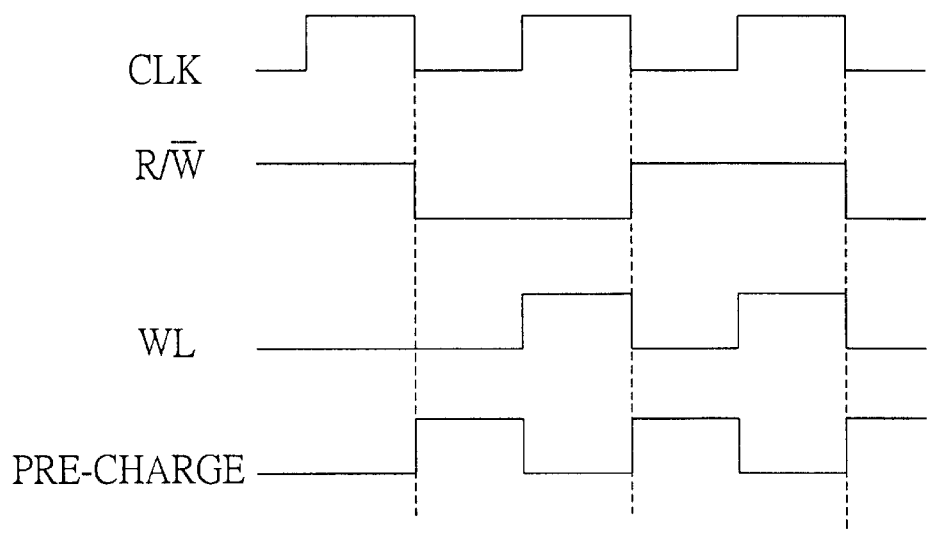
FIG. 11 is a timing diagram of the read/write cycle of the memory system configured by the conventional Four-Transistor pseudo static random access memory cells.

In operation of the embedded auto-refresh circuit for static random access memory in accordance with the present invention, the counter 15 performs a counting cycle for every N clocks, where N is a multiple of the number of all word lines 12. In this preferred embodiment, it is assumed that there are sixteen word lines 12 and the shift register 16 is of sixteen bits, and thus the counter 151 performs a counting cycle for every sixteen clocks. With reference to FIG. 4, initially, the counter 151 has a count value of "0" and the shift register 16 is initialized to "1000000000000000", as depicted in FIG. 4A. Therefore, when entering a memory read/write cycle, taken in conjunction with FIG. 1 and FIG. 5, the first pulse of the pre-charge signal 153 first drives the pre-charge circuit 14 to charge the bit line pair. Then, the outputs of the shift register 16 are respectively ANDed with the refresh signal 154, and the outputs of the AND operations are in turn ORed with the outputs of the address decoder 17, respectively. As a result, a logic "1" is generated on the first word line 121, so as to embed a pseudo read operation for refreshing the cells 11 on the first word line 121. Subsequently, the second pulse of the pre-charge signal 153 drives the pre-charge circuit 14 again to charge the bit line pair and, then, a general random memory access process is performed on a word line 12 selected by the address decoder 17.

In the next memory read/write cycle, with reference to FIG. 4B, the counter 151 has a count value of "1" and the shift register 16 is shifted one bit to "0100000000000000."

Therefore, when entering the read/write cycle, the first pulse of the pre-charge signal 153 first drives the pre-charge circuit 14 to charge the bit line pair. Then, the outputs of the shift register 16 are respectively ANDed with the refresh signal 154, and the outputs of the AND operations are in turn ORed with the outputs of the address decoder 17, respectively. As a result, a logic "1" is generated on the second word line 122, so as to embed a pseudo read operation for refreshing the cells 11 on the second word line 122. Subsequently, the second pulse of the pre-charge signal 153 drives the pre-charge circuit 14 again to charge the bit line pair, and then, a general random memory access process is performed on a word line 12 selected by the address decoder 17.

Continuing the above memory read/write cycles, when the counter 151 has a count value of "15", the shift register 16 is shifted 15 bits to "0000000000000001", as shown in FIG. 4C. Similarly, when entering a memory read/write cycle, the first pulse of the pre-charge signal 153 first drives the pre-charge circuit 14 to charge the bit line pair. Then, the outputs of the shift register 16 are respectively ANDed with the refresh signal 154, and the outputs of the AND operations are in turn ORed with the outputs of the address decoder 17, respectively. As a result, a logic "1" is generated on the sixteenth word line 126, so as to embed a pseudo read operation for refreshing the cells 11 on the sixteenth word line 126. Subsequently, the second pulse of the pre-charge signal 153 drives the pre-charge circuit 14 again to charge the bit line pair and, then, a general random memory access process is performed on a word line 12 selected by the address decoder 17. Accordingly, sixteen pseudo read operations are automatically embedded in sixteen general random memory access cycles, respectively, thereby accomplishing the refresh of memory. Thereafter, the counter 151 outputs a logic "1" as a counting cycle is completed, whereby the shift register 16 is again initialized to "1000000000000000" in the next read/write cycle, so as to continue the above memory access and refresh operation.

In view of the foregoing, it is appreciated that the embedded auto-refresh circuit for static random access memory in accordance with the present invention is able to automatically refresh memory by utilizing the auto-refresh generation circuit 15 to embed a one-shot auto-refresh when the memory is pre-charged, so that no additional pseudo read cycle is required. Such a circuit is provided with the following advantages:

1. The data processing bandwidth is not wasted because the system does not need to be halted while performing memory refresh, and thus the performance of the system employing Four-Transistor pseudo SRAM is approximated to that employing Six-Transistor SRAM.
2. No refresh control circuit is required because the system does not need to be halted while performing memory refresh.
3. The manufacturing cost is reduced and the layout area is decreased as the size of the Four-Transistor pseudo SRAM is about half of the Six-Transistor SRAM.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An embedded auto-refresh circuit for refreshing pseudo static random access memory cells, comprising:

a shift register driven by a clock signal to perform shift operations; and an auto-refresh generation circuit having a pre-charge and refresh signal generator driven by said clock signal to generate a refresh signal and a pre-charge signal, said pre-charge signal having a first and a second pulse, wherein, in a memory access cycle, a plurality of memory cells on a word line determined by said refresh signal and said shift register are refreshed by a pseudo read operation based on said first pulse and said refresh signal, and then a general random memory access process is performed by taking said second pulse as a pre-charge signal.

2. The embedded auto-refresh circuit as claimed in claim 1, wherein said first pulse, said refresh signal and said second pulse are sequentially and continuously generated in a predetermined level of one clock in said clock signal.

3. The embedded auto-refresh circuit as claimed in claim 2, wherein said predetermined level is a low voltage level.

4. The embedded auto-refresh circuit as claimed in claim 1, wherein said auto-refresh generation circuit has a counter to cyclically count the number of clocks in said clock signal so as to generate an output with a predetermined logic level for being applied to said shift register at the end of a counting cycle, thereby driving said shift register to perform a cyclically shift operation.

5. The embedded auto-refresh circuit as claimed in claim 4, wherein said predetermined logic level is logic one.

6. The embedded auto-refresh circuit as claimed in claim 4, wherein said counter performs a counting cycle for every N clocks, where N is a multiple of the number of all word lines.

7. The embedded auto-refresh circuit as claimed in claim 1, wherein said shift register has a plurality of bits, each having an output that is ANDed with said refresh signal by an AND gate, each AND gate having an output that is ORed with a corresponding encoding output of an address decoder by an OR gate, each OR gate having an output connected to a corresponding word line.

8. The embedded auto-refresh circuit as claimed in claim 1, wherein said pre-charge and refresh signal generator comprises:

a falling edge detector for detecting a falling edge of said clock signal;

a pulse generator connected to said falling edge detector for generating a pulse when said falling edge detector detects a falling edge; and two serially connected delay elements connected to said pulse generator for delaying said pulse to obtain a one-time delayed pulse and a two-time delayed pulse, wherein said one-time delayed pulse is provided as said refresh signal, and said two-time delayed pulse is combined with said pulse to generate said pre-charge signal.

9. The embedded auto-refresh circuit as claimed in claim 8, wherein said pulse has a width about one third of the low level duration of one clock in said clock signal.

10. The embedded auto-refresh circuit as claimed in claim 8, wherein each delay element has a delay time about one third of the low level duration of one clock in said clock signal.

* * * * *